(12) United States Patent
Suzuki et al.

(10) Patent No.: US 10,564,487 B2
(45) Date of Patent: Feb. 18, 2020

(54) ELECTRONIC DEVICE COMPRISING FIRST AND SECOND CONDUCTIVE LINES THAT FORM A COIL WITH A BRIDGE LINE AND DISPLAY DEVICE

(71) Applicant: Japan Display Inc., Tokyo (JP)

(72) Inventors: Daichi Suzuki, Tokyo (JP); Hiroshi Mizuhashi, Tokyo (JP); Hayato Kurasawa, Tokyo (JP); Yuji Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 52 days.

(21) Appl. No.: 15/682,945

(22) Filed: Aug. 22, 2017

(65) Prior Publication Data

US 2018/0061869 A1 Mar. 1, 2018

(30) Foreign Application Priority Data

Aug. 25, 2016 (JP) ................. 2016-164689

(51) Int. Cl.
*G02F 1/1343* (2006.01)
*H01L 27/12* (2006.01)
(Continued)

(52) U.S. Cl.
CPC ...... *G02F 1/134309* (2013.01); *H01L 27/124* (2013.01); *H01L 27/1255* (2013.01); *G02F 2001/133565* (2013.01); *G02F 2001/136295* (2013.01); *G02F 2201/121* (2013.01); *G02F 2201/123* (2013.01); *H01Q 1/243* (2013.01); *H01Q 7/00* (2013.01)

(58) Field of Classification Search
CPC ..... H01L 27/3225; G02F 2001/133565; G02F 2001/13685
See application file for complete search history.

(56) References Cited

U.S. PATENT DOCUMENTS

| 2004/0189625 A1 | 9/2004 | Sato |
| 2005/0225486 A1 | 10/2005 | Furuki et al. |

(Continued)

FOREIGN PATENT DOCUMENTS

| JP | 2001-236479 A | 8/2001 |
| JP | 2005303543 A | 10/2005 |

(Continued)

OTHER PUBLICATIONS

Japanese Office Action dated Dec. 3, 2019, corresponding to Japanese Patent Application No. 2016-164689.

*Primary Examiner* — Paul C Lee
(74) *Attorney, Agent, or Firm* — Michael Best & Friedrich LLP

(57) ABSTRACT

According to one embodiment, an electronic device includes a first substrate including a first conductive layer, and a second substrate including a second conductive layer which is connected to the first conductive layer and which has a thickness larger than a thickness of the first conductive layer, a bridge line which has a thickness larger than the thickness of the first conductive layer and which is connected to the second conductive layer, and an insulating layer which is located between the second conductive layer and the bridge line. The first conductive layer, the second conductive layer and the bridge line form a coil.

20 Claims, 13 Drawing Sheets

(51) Int. Cl.
    *G02F 1/1362*    (2006.01)
    *G02F 1/1335*    (2006.01)
    *H01Q 1/24*      (2006.01)
    *H01Q 7/00*      (2006.01)

(56) References Cited

U.S. PATENT DOCUMENTS

| | | |
|---|---|---|
| 2010/0182207 A1 | 7/2010 | Miyata et al. |
| 2015/0077296 A1* | 3/2015 | An .................. H01P 11/00 |
| | | 343/720 |
| 2015/0225648 A1* | 8/2015 | Kawamura ........... G02F 1/133 |
| | | 252/299.61 |
| 2016/0261026 A1* | 9/2016 | Han ................ H01Q 1/243 |
| 2017/0004921 A1* | 1/2017 | Kim ................ H02J 50/10 |

FOREIGN PATENT DOCUMENTS

| | | | | |
|---|---|---|---|---|
| JP | 2007012042 A | | 1/2007 | |
| JP | 2015-2479 A | | 1/2015 | |
| JP | 2015513276 A | | 4/2015 | |
| JP | 2015148699 A | | 8/2015 | |
| JP | 2016127018 A | | 7/2016 | |
| JP | 2016224638 A | * | 12/2016 | ............ G06F 3/046 |
| WO | 2009/041119 A1 | | 4/2009 | |
| WO | 2016/121716 A1 | | 8/2016 | |

* cited by examiner

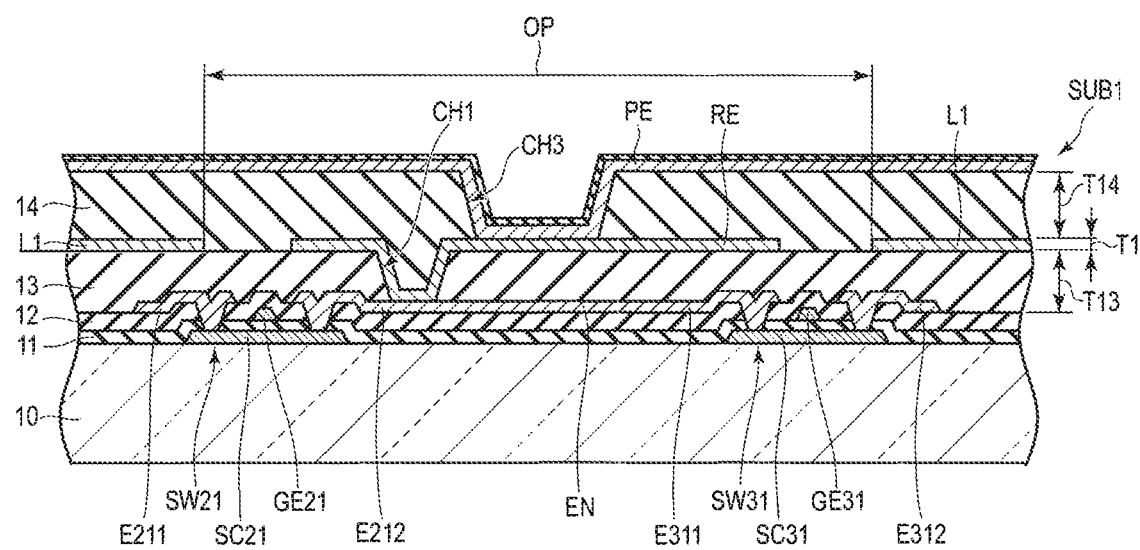
F I G. 4

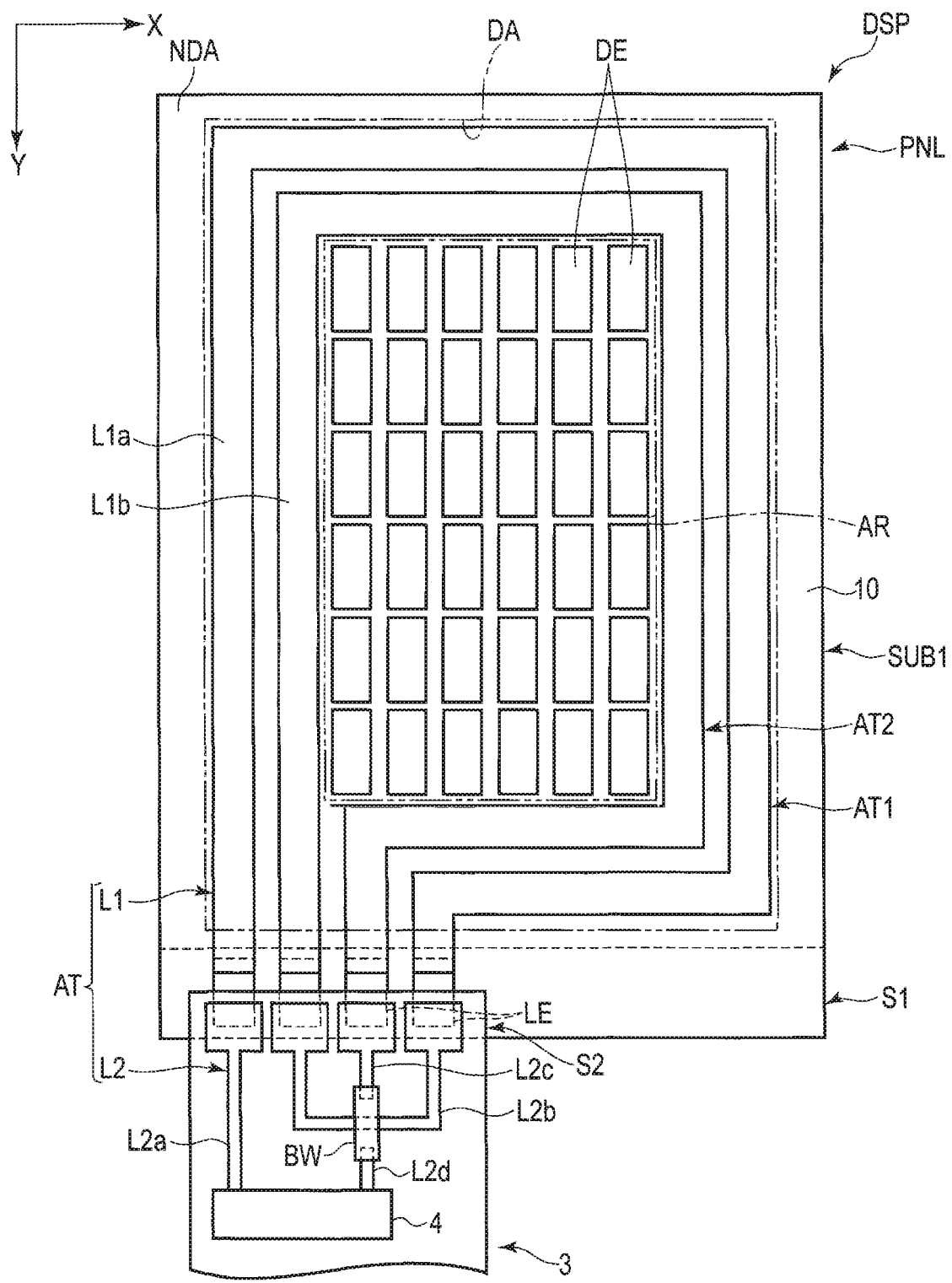
F I G. 14

ELECTRONIC DEVICE COMPRISING FIRST AND SECOND CONDUCTIVE LINES THAT FORM A COIL WITH A BRIDGE LINE AND DISPLAY DEVICE

CROSS-REFERENCE TO RELATED APPLICATIONS

This application is based upon and claims the benefit of priority from Japanese Patent Application No. 2016-164689, filed Aug. 25, 2016, the entire contents of which are incorporated herein by reference.

FIELD

Embodiments described herein relate generally to an electronic device and a display device.

BACKGROUND

Recently, display devices such as liquid crystal display devices have been used in various technical fields. A technology of providing a memory in each pixel of the display devices for gradation display processing has been disclosed.

Several display devices comprise not only a display function, but also a short-range wireless communication function. An example of a communication protocol for the short-range wireless communication is Near Field Communication (NFC). Antenna devices configured to transmit and receive information by using, for example, the NFC function and mounted on small communication devices such as mobile telephones are well known.

BRIEF DESCRIPTION OF THE DRAWINGS

FIG. 4 is a cross-sectional view showing an array substrate of the display panel.

FIG. 5 is a plan view showing the display device, illustrating an example of arrangement of a coil, dummy electrodes, and the like.

FIG. 14 is a plan view showing the display device according to modified example 1 of the embodiment, illustrating an example of arrangement of a coil, dummy electrodes and the like.

DETAILED DESCRIPTION

Figure 1:
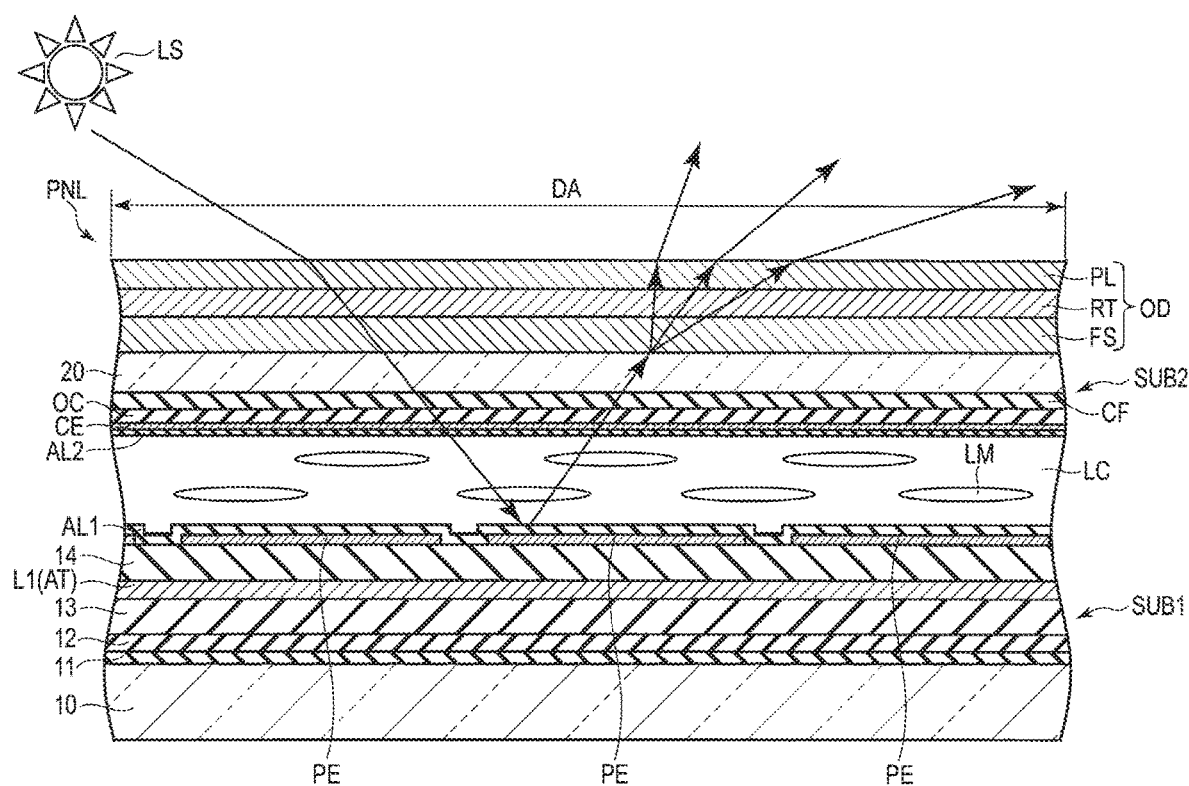
FIG. 1 is a cross-sectional view showing a display panel of a display device according to one of embodiments.

In general, according to one embodiment, there is provided an electronic device, comprising: a first substrate including a first conductive layer; and a second substrate including a second conductive layer which is connected to the first conductive layer and which has a thickness larger than a thickness of the first conductive layer, a bridge line which has a thickness larger than the thickness of the first conductive layer and which is connected to the second conductive layer, and an insulating layer which is located between the second conductive layer and the bridge line, the first conductive layer, the second conductive layer and the bridge line forming a coil.

According to another embodiment, there is provided a display device, comprising: a first substrate including a scanning line, a signal line, and a first conductive layer located in a layer different from a layer of the scanning line and the signal line; and a second substrate including a second conductive layer which is connected to the first conductive layer and which has a thickness larger than a thickness of the first conductive layer, a bridge line which has a thickness larger than the thickness of the first conductive layer and which is connected to the second conductive layer, and an insulating layer which is located between the second conductive layer and the bridge line, the first conductive layer, the second conductive layer and the bridge line forming a coil.

Embodiments and modified examples will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First, a display device DSP according to one of the embodiments will be described in detail.

In the present embodiment, a liquid crystal display device is described as an example of the display device. The display device can be applied to various devices such as a smartphone, a tablet terminal, a mobile telephone terminal, a personal computer, a television receiver, a vehicle-mounted device, a game console, and a card display composed of a display built in what is called a traffic IC card or the like.

In the present embodiment, the display device DSP comprises a reflective type display panel PNL. Next, a configuration example of the display panel PNL will be explained.

FIG. 1 is a cross-sectional view showing the display panel PNL. FIG. 1 shows a cross-section of the display panel PNL in a display area DA for displaying an image. The illustrated display panel PNL is a liquid crystal display panel. Constituent elements necessary for explanations alone are illustrated in the figure.

As shown in FIG. 1, the display panel PNL comprises an array substrate SUB1 serving as a first substrate, a counter-substrate SUB2, a liquid crystal layer LC and an optical element OD. The liquid crystal layer LC corresponds to a display function layer.

The array substrate SUB1 includes a first insulating substrate 10, a first insulating film 11, a second insulating film 12, a third insulating film 13, a first conductive layer L1, a fourth insulating film 14, pixel electrodes PE, a first alignment film AL1, and the like. In the present embodiment, the first insulating substrate 10 is a glass substrate. Unlike the present embodiment, however, the first insulating substrate 10 may be an insulating substrate such as a resin substrate other than a glass substrate. The first insulating film 11 is located on the first insulating substrate 10. The second insulating film 12 is located on the first insulating film 11. The third insulating film 13 is located on the second insulating film 12.

The first conductive layer L1 forms a part of a coil AT. The first conductive layer L1 is located on the third insulating film 13. The first conductive layer L1 is covered with the fourth insulating film 14. The pixel electrodes PE are located on the fourth insulating film 14. In other words, the pixel electrodes PE are located at a position higher than the first insulating substrate 10, and the first conductive layer L1 is located between the first insulating substrate 10 and the pixel electrodes PE. Each of the pixel electrodes PE corresponds to a reflecting electrode and includes a light reflecting layer formed of a metal material such as aluminum or silver which has optical reflectivity. For this reason, the display panel PNL of the present embodiment is a reflective type liquid crystal display panel. The first alignment film AL1 covers the pixel electrodes PE.

The display panel PNL of the present embodiment needs only to include a light reflecting layer. For this reason, the light reflecting layer may be provided separately from the pixel electrodes PE, in the display panel PNL.

The counter-substrate SUB2 includes a second insulating substrate 20, a color filter layer CF, an overcoat layer OC, a common electrode CE, a second alignment film AL2, and the like. In the present embodiment, the second insulating substrate 20 is a glass substrate. Unlike the present embodiment, however, the second insulating substrate 20 may be an insulating substrate such as a resin substrate other than a glass substrate. The color filter layer CF is located on a side opposed to the array substrate SUB1 of the second insulating substrate 20. The overcoat layer OC covers the color filter layer CF. The common electrode CE is formed on a surface of the overcoat layer OC which is opposed to the array substrate SUB1. The common electrode CE is formed of a transparent, electrically conductive material such as indium tin oxide (ITO) or indium zinc oxide (IZO). The second alignment film AL2 covers the common electrode CE.

Unlike the present embodiment, however, the color filter layer CF may be provided not on the counter-substrate SUB2 side but on the array substrate SUB1 side.

The common electrode CE is shaped in a plate having an area corresponding to at least the display area DA and opposed to the pixel electrodes PE. The shape of the common electrode CE is not limited to a plate uniformly opposed to the pixel electrodes PE. For example, the shape of the common electrode CE may be a stripe shape of being divided into stripes or a matrix shape of being divided in a matrix. If the common electrode CE is divided as mentioned above, a slit is formed between the divided common electrodes CE and the position of the slit desirably corresponds to a position which sections pixels (pixels PX to be explained later) such as a position opposed to various lines disposed on the array substrate SUB1.

The liquid crystal layer LC is held between the array substrate SUB1 and the counter-substrate SUB2 and is in contact with the first alignment film AL1 and the second alignment film AL2. The liquid crystal layer LC includes liquid crystal molecules LM.

The optical element OD is provided on a surface located on the opposite side to a surface which is in contact with the liquid crystal layer LC, on the counter-substrate SUB2. The optical element OD includes, for example, a scattering layer FS, a retardation film RT, a polarizer PL and the like. The scattering layer FS is adhered to the second insulating substrate 20, the retardation film RT is stacked on the scattering layer FS, and the polarizer PL is stacked on the retardation film RT. The configuration of the optical element OD is not limited to the example illustrated.

The scattering layer FS is an anisotropically scattering layer which urges light incident from a specific direction to be scattered. In the example illustrated, the scattering layer FS has a function of hardly scattering but transmitting the incident light from a light source LS side in the figure and urging the reflected light in a specific direction, i.e., on the pixel electrodes PE to be scattered. The retardation film RT has a function of serving as a quarter-wave plate. For example, the retardation film RT is a stacked body obtained by stacking a quarter-wave plate and a half-wave plate and is configured to reduce a wavelength dependency and to obtain a desired phase difference within a wavelength range used for color display.

In this display panel PNL, a side close to the light source LS corresponds to a display surface side. In the example illustrated, a surface of the optical element OD corresponds to the display surface but, if a cover member is disposed on the surface of the optical element OD, a surface of the cover member corresponds to the display surface.

In the present embodiment, several parts of the coil AT are built in the display panel PNL. The coil AT functions as, for example, an NFC antenna applied to Near Field Communication (NFC). NFC is a short-range wireless communication technology employed in a communication range of approximately 10 cm using a frequency of 13.56 MHz.

The mode of the coil AT is not particularly limited and, for example, NFC-Type F, NFC-Type A, NFC-Type B and the like are applicable as NFC. In addition, Radio Frequency Identifier (RFID) using an electromagnetic field, a radio wave and the like is applicable as a short-range wireless communication technology in a broader sense. RFID indicates the overall short-range wireless communication technology and NFC standardized under certain criteria. In the present embodiment, the coil AT is applicable to RFID. In addition, the types of RFID include a passive type which operates with an electromagnetic wave from a reader without incorporating a battery, an active type which incorporates a battery and generates an electromagnetic wave by itself, a semi-active type combining the passive type and the active type, and the like. Various coils used for RFID are equal with respect to basic transmission a reception methods and, in the present invention, any coils can be used for the display device DSP. Alternatively, the coil AT can also be used for charging.

According to the present embodiment, the display device DSP comprises a first conductive layer L1 located between the first insulating substrate 10 and the pixel electrodes PE serving as reflecting electrodes, in the display area DA. The pixel electrodes PE are located in a layer (display surface side) upper than the first conductive layer L1. For this reason, reduction in area of the aperture contributing to display which is caused by building the first conductive layer L1 (coil AT) in the display panel PNL, and inconvenience that the first conductive layer L1 is visually recognized when the display image is observed from the display surface side, and the like, can be suppressed. A high-performance display device comprising both the image display function and the NFC function can be provided, based on the above-described matters.

Next, a configuration example of the display device will be explained.

Figure 2:
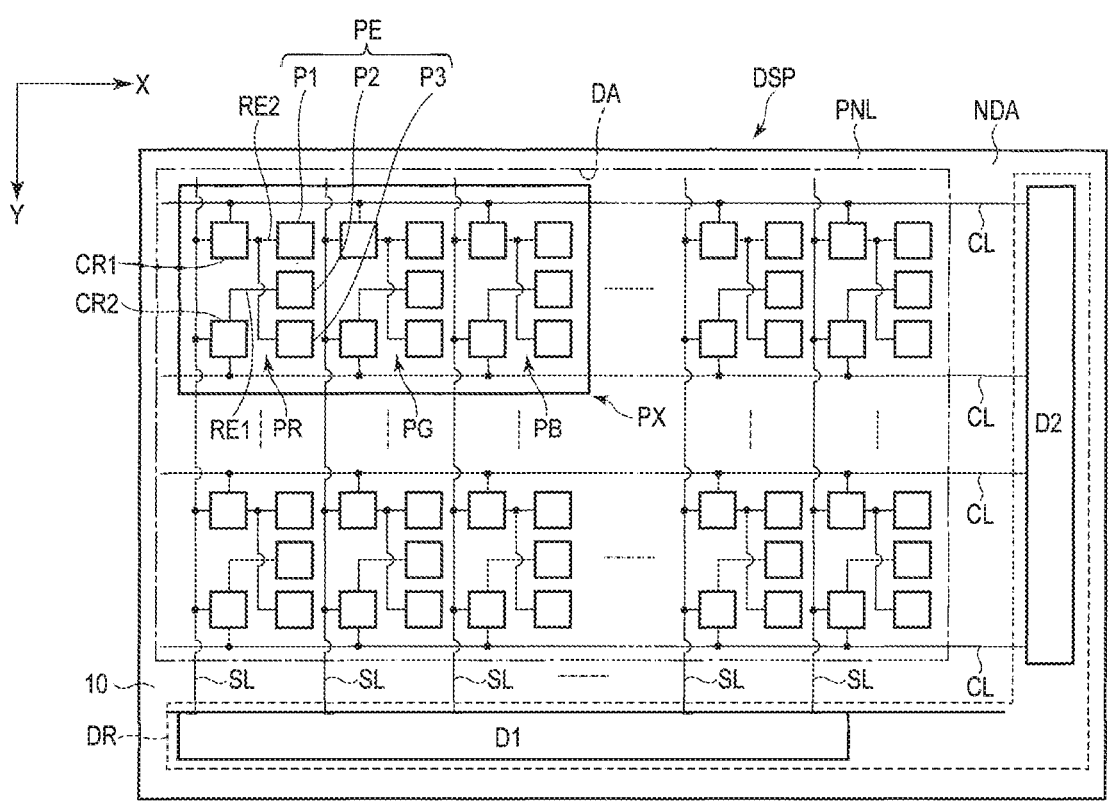
FIG. 2 is a diagram showing a configuration of the display panel and an equivalent circuit.

FIG. 2 shows a configuration example of the display device DSP. In the example illustrated, the display device DSP comprises a display panel PNL, a driving module DR and the like. In addition, the first conductive layer L1 is built in the display panel PNL as shown in FIG. 1.

The display panel PNL includes a display area DA on which an image is displayed and a non-display area NDA which is a region other than the display area DA. In the present embodiment, the non-display area NDA is a frame region surrounding the display area DA. In addition, the display panel PNL includes signal lines SL, scanning lines CL, unit pixels PX, conductive lines and power source lines for transmission of various voltages (not shown) and the like. The signal lines SL are arranged in the first direction X. The scanning lines CL are arranged in the second direction Y intersecting the first direction X. The unit pixels PX are arrayed in a matrix on an X-Y plane defined by the first direction X and the second direction Y.

In present embodiment, the first direction X and the second direction Y are orthogonal to each other but may intersect each other and may be in the other intersecting state of being approximately orthogonal to each other. In addition, viewing the display panel PNL from a direction (normal direction) orthogonal to the X-Y plane formed by the first direction X and the second direction Y is called planar view.

The unit pixel PX is a minimum unit for constituting the color image. The unit pixel PX is composed of a plurality of sub-pixels to be explained later. For example, the unit pixel PX comprises a sub-pixel PR exhibiting a red color, a sub-pixel PG exhibiting a green color, and a sub-pixel PB exhibiting a blue color. In addition, the unit pixel PX may comprise a sub-pixel exhibiting the other color such as a white color besides the sub-pixels of three colors. The sub-pixels PR, PG and PB have approximately the same configuration, and the configuration of the sub-pixel PR will be particularly explained in more detail.

The sub-pixel PR comprises the pixel electrode PE and pixel circuits CR1 and CR2. The pixel electrode PE includes three partial electrodes P1, P2 and P3. For example, the partial electrodes P1, P2 and P3 are aligned and each of them has an equal area and is formed in a square shape in the example illustrated. The partial electrode P2 is electrically connected with the pixel circuit CR2 by a connection line RE1. The partial electrodes P1 and P3 are electrically connected with each other and electrically connected with the pixel circuit CR1, via a connection line RE2. In other words, the partial electrodes P1 and P3 are separated while sandwiching the partial electrode P2 but electrically connected with each other and driven together.

The above-explained sub-pixel is composed of a plurality of segments SG and, in the example illustrated, a combination of the partial electrode P2, the connection line RE1 and the pixel circuit CR2 corresponds to one segment and a combination of the partial electrodes P1 and P3, the connection line RE2 and the pixel circuit CR1 corresponds to one segment. A concrete configuration example of the segment SG will be explained later with reference to FIG. 3A.

In the present embodiment, the segment SG has a configuration employing what is called Memory In Pixel (MIP) comprising a memory unit capable of storing data. According to this configuration, the memory unit can store binary data (logic 1/logic 0) and the gradation of each sub-pixel is digitally displayed based on the binary data. In the present embodiment, an area gradation method of constituting one sub-pixel of the segments SG and implementing gradation display by combination of areas of the segments SG is employed as the gradation expression using such binary data. The "area gradation method" is a gradation expression scheme of expressing $2^n$ gradations by n segments SG of an area ratio weighted by $2^0, 2^1, 2^2, \ldots,$ and $2^{n-1}$. In the present embodiment, the area of the segment SG is assumed to correspond to total areas of the partial electrodes included in each segment.

In the present embodiment, $2^3$ gradations can be expressed by combination of total control of the partial electrodes P1 and P3 and independent control of the partial electrode P2.

In a memory display mode, the gradations of the sub-pixels are expressed by using the data held in a memory module. For this reason, a write operation of writing the signal potential on which the gradation is reflected in each sub-pixel does not need to be executed in a frame cycle. Power consumption of the display device can be therefore decreased in the memory display mode.

The configuration example shown in FIG. 2 corresponds to a configuration employing 2-bit MIP. As explained above, each sub-pixel comprises the partial electrodes P1, P2 and P3 having an equal area, and the partial electrodes P1 and P3 are electrically connected to each other. For this reason, an area ratio between the area of the partial electrode P2 and the total area of the partial electrodes P1 and P3 is 1:2. The gradation display is thereby implemented in each of the sub-pixels. In addition, each sub-pixel comprises the connection lines, and the connection lines are, for example, lines located in the layer between the pixel circuits CR and the pixel electrode PE to make electric connection between the pixel circuits CR and the pixel electrode PE.

The driving module DR comprises a signal line driving module D1 and a scanning line driving module D2. Each of the signal lines SL is connected to the signal line driving module D1. The signal line driving module D1 outputs, for example, a signal potential corresponding to a predetermined gradation to the corresponding signal line SL. Each of the scanning lines CL is connected to the scanning line driving module D2. The scanning line driving module D2 outputs a control signal to control an operation of writing the signal potential to the sub-pixel, to the corresponding scanning line CL. The driving module DR may further comprise a drive timing generating circuit, a power supply circuit and the like.

Figure 3A:
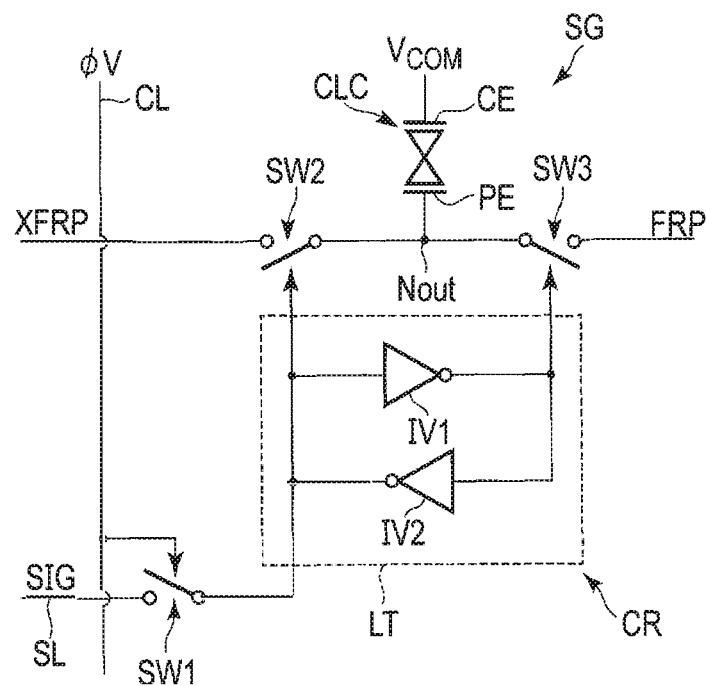
FIG. 3A is a diagram showing a configuration of a segment employing MIP system.

FIG. 3A is a diagram showing a configuration example of the segment SG employing MIP system. More specifically, FIG. 3A is a diagram showing a configuration example of the segment SG explained with reference to FIG. 2.

As shown in FIG. 3A, each of the segments SG comprises a liquid crystal capacitance CLC and a pixel circuit CR. The liquid crystal capacitance CLC indicates a capacitance component of the liquid crystal layer generated between the pixel electrode PE and the common electrode CE. The pixel electrode PE which will be explained below corresponds to the partial electrode electrically connected to the pixel circuit CR explained with reference to FIG. 2. A common voltage Vcom is applied to the common electrode CE.

The pixel circuit CR comprises three switches SW1 to SW3 and a latch circuit LT. The switch SW1 is composed of, for example, an N-ch MOS transistor. The switch SW1 has an end connected to the signal line SL and the other end connected to the latch circuit LT. Turning on and off the switch SW1 is controlled by a scanning signal supplied from the scanning line CL. The switch SW1 is turned on (conductive) by being supplied with a scanning signal φV from the scanning line driving module D2 shown in FIG. 2 via the scanning line CL and takes in data (signal potential corresponding to the gradation) SIG supplied from the signal line driving module D1 shown in FIG. 2 via the signal line SL.

The latch circuit LT comprises inverters IV1 and IV2 connected parallel in opposite directions. Each of the inverters IV1 and IV2 is composed of, for example, a CMOS inverter. The latch circuit LT holds (latches) an electric potential corresponding to data SIG taken in by the switch SW1.

Each of the switches SW2 and SW3 is composed of a transfer switch constituted by connecting the N-ch MOS transistor and the P-ch MOS transistor in parallel, but can also be configured of transistors having the other configuration. An end of the switch SW2 is supplied with a voltage XFRP having a phase opposite to a phase of the common voltage Vcom. An end of the switch SW3 is supplied with a voltage FRP having the same phase as the phase of the common voltage Vcom. The other ends of the switches SW2 and SW3 are connected to each other, electrically connected to the pixel electrode PE, and become an output node Nout of the pixel circuit CR. Either of the switches SW2 and SW3 becomes on state in accordance with the polarity of the holding potential of the latch circuit LT. The in-phase voltage FRP or opposite-phase voltage XFRP is applied to the pixel electrode PE, in the liquid crystal capacitance CLC in which the common voltage Vcom is applied to the common electrode CE.

Figure 3B:
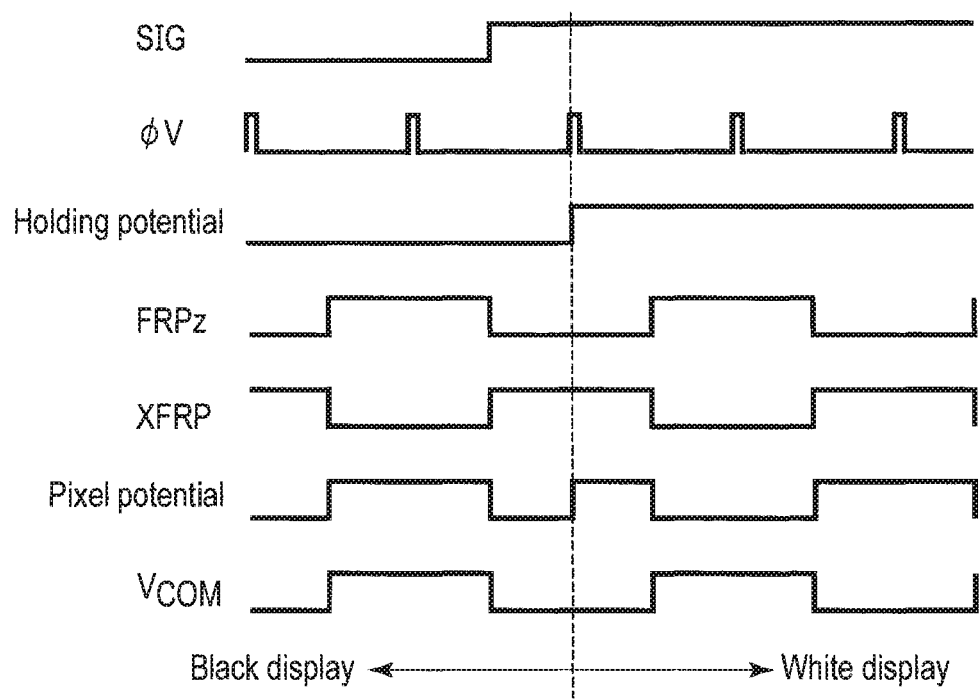
FIG. 3B is a timing chart for explanation of an operation of the segment employing MIP system.

FIG. 3B is a timing chart for explanation of an operation of the segment SG employing MIP system. An example of applying a normally black mode of exhibiting black in a state in which the voltage is not applied to the liquid crystal layer LC will be explained.

As shown in FIG. 3B and FIG. 3A, the pixel circuit CR takes in the data SIG supplied to the signal line SL and holds an electric potential corresponding to the data SIG in the latch circuit LT, at timing at which the control signal φV is supplied to the switch SW1. If the pixel circuit CR takes in data SIG corresponding to logic "0", the polarity of the holding potential of the latch circuit LT becomes negative. In this case, the switch SW2 is turned off (non-conductive), the switch SW3 is turned on (conductive) and the voltage FRP in phase with the common voltage Vcom is applied to the pixel electrode PE. The pixel potential of the pixel electrode PE becomes thereby equivalent to the common voltage Vcom of the common electrode. For this reason, the voltage is not applied to the liquid crystal layer LC and the segment SG exhibits black.

In contrast, if the pixel circuit CR takes in data SIG corresponding to logic "1", the polarity of the holding potential of the latch circuit LT becomes positive. In this case, the switch SW3 is turned off (non-conductive), the switch SW2 is turned on (conductive) and the voltage XFRP in opposite phase to the common voltage Vcom is applied to the pixel electrode PE. A potential difference is thereby generated between the pixel potential of the pixel electrode PE and the common voltage Vcom of the common electrode. In other words, a voltage is applied to the liquid crystal layer LC. For this reason, the segment SG exhibits white since the light transmitted through the liquid crystal layer LC is modulated and part of the light contributes to the display.

Thus, in the configuration employing MIP system, the in-phase voltage FRP or the opposite-phase voltage XFRP is applied to the pixel electrode PE, by setting either the switch SW2 or SW3 to be the on state in accordance with the polarity of the holding potential of the latch circuit LT. Since a constant voltage is thereby applied to the segment SG at any time, shading can be suppressed.

In the example described, a static random access memory (SRAM) is used as a memory built in the segment SG but the memory is not limited to this and the other constituent element such as a dynamic random access memory (DRAM) may be used.

Unlike the present embodiment, the sub-pixel may not be composed of the segment SG employing MIP system. The sub-pixel may not employ MIP system. The number, area and shape of the partial electrodes P of the pixel electrode PE are not limited. Alternatively, the pixel electrode PE may not be divided.

FIG. 4 is a cross-sectional view showing the array substrate SUB1 of the display panel PNL shown in FIG. 1.

As shown in FIG. 4, the array substrate SUB1 further includes switches SW21 and SW31, a connection line RE, and the like on the first insulating substrate 10. The switch SW21 corresponds to the switch SW2 shown in FIG. 3A. The switch SW31 corresponds to the switch SW3 shown in FIG. 3A.

The switch SW21 comprises a semiconductor layer SC21, a gate electrode GE21, a first electrode E211, and a second electrode E212. Either of the first electrode E211 and the second electrode E212 functions as a source electrode while the other electrode functions as a drain electrode. The switch SW31 comprises a semiconductor layer SC31, a gate electrode GE31, a third electrode E311, and a fourth electrode E312. Either of the third electrode E311 and the fourth electrode E312 functions as a source electrode while the other electrode functions as a drain electrode.

The semiconductor layers SC21 and SC31 are located on the first insulating substrate 10 and covered with the first insulating film 11. The gate electrodes GE21 and GE31 are located on the first insulating film 11 and covered with the second insulating film 12. The scanning line CL is also located on the first insulating film 11 and covered with the second insulating film 12, which is not illustrated. The first electrode E211, the second electrode E212, the third electrode E311, and the fourth electrode E312 are located on the second insulating film 12 and covered with the third insulating film 13. The signal line SL is also located on the second insulating film 12 and covered with the third insulating film 13, which is not illustrated. Each of the first electrode E211 and the second electrode E212 is in contact with the semiconductor layer SC21, and each of the third electrode E311 and the fourth electrode E312 is in contact with the semiconductor layer SC31. The third electrode E311 is joined to the second electrode E212 to constitute a node electrode EN. The node electrode EN is located on the second insulating film 12 and covered with the third insulating film 13.

The connection line RE is located on the third insulating film 13. The connection line RE is electrically connected with the node electrode EN through a contact hole CH1 formed in the third insulating film 13. The first conductive layer L1 is located on the third insulating film 13. The first conductive layer L1 is located in the same layer as the connection line RE. In other words, the first conductive layer L1 is located in the layer different from the scanning line CL and the signal line SL. Furthermore, the first conductive layer L1 is not intervened between the first insulating film 11 and the second insulating film 12 or between the second insulating film 12 and the third insulating film 13. The first conductive layer L1 includes an opening OP. The connection line RE is located inside the opening OP. The connection line RE and the first conductive layer L1 are located under the pixel electrode PE. For this reason, influence of the pixel electrode PE (light reflecting layer) to the display can be reduced.

The first conductive layer L1 is formed of, for example, a metallic material such as gold, silver, copper, aluminum or nickel. The connection line RE is formed of, for example, a transparent conductive material such as ITO or IZO, and the first conductive layer L1 and the connection line RE may be formed of the same metallic material. In the present embodiment, a thickness T1 of the first conductive layer L1 is 500 nm and a sheet resistance of the first conductive layer L1 is 0.028Ω/□ (Ω/square).

The connection line RE and the first conductive layer L1 are covered with the fourth insulating film 14. In other words, the connection line RE and the first conductive layer L1 are located between the third insulating film 13 and the fourth insulating film 14. In the present embodiment, each of a thickness T13 of the third insulating film 13 and a thickness T14 of the fourth insulating film 14 is in a range of 2 to 3 μm.

The pixel electrode PE is located on the fourth insulating film 14 and covered with the first alignment film AL1. The pixel electrode PE is in contact with the connection line RE through a contact hole CH3 penetrating the fourth insulating film 14. The pixel electrode PE corresponds to any one of the partial electrodes P1 to P3 and the connection line RE corresponds to the connection line RE1 or RE2.

The first insulating film 11 and the second insulating film 12 are formed of an inorganic material such as silicon nitride or silicon oxide. The third insulating film 13 and the fourth insulating film 14 are formed of an organic material such as a resin material. The pixel circuit CR including the switches SW21 and SW31 as shown in FIG. 3A is located between the first insulating substrate 10 and the fourth insulating film 14.

Since the connection line RE and the first conductive layer L1 are thus located in the same layer in the array substrate SUB1, the first conductive layer L1 can be built in the substrate without increasing the thickness of the array substrate SUB1.

Figure 5:
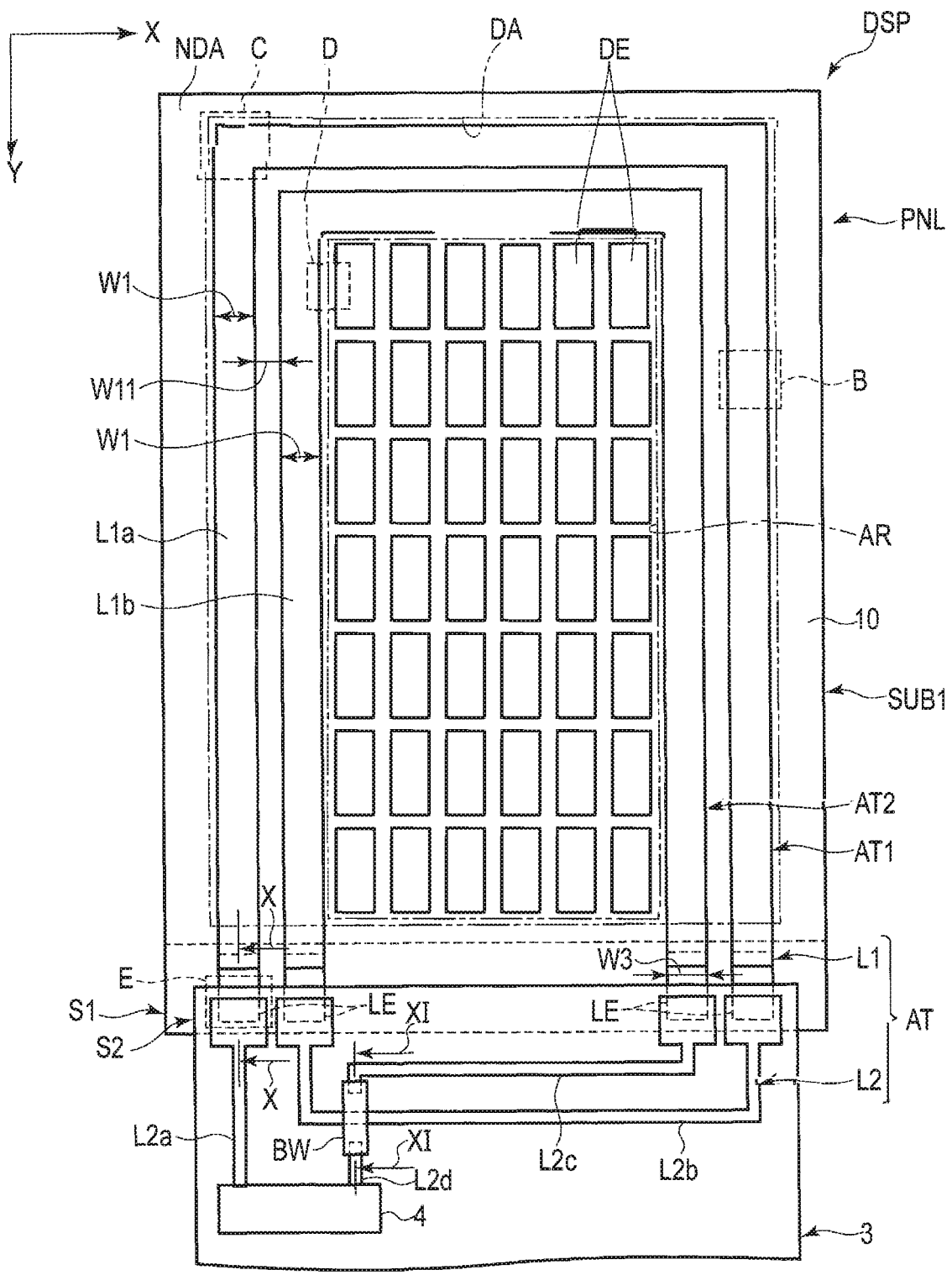

FIG. 5 is a plan view showing the display device DSP, illustrating an example of arrangement of a coil AT, dummy electrodes DE and the like. The figure indicates a plan view in an X-Y plane defined by the first direction X and the second direction Y. First, arrangement of the coil AT and the dummy electrodes DE in planar view will be explained.

As shown in FIG. 5, the coil AT has a loop shape which is not overlaid in the same plane. The coil AT comprises a first conductive layer L1, a second conductive layer L2, a bridge line BW, and a lead line LE.

The array substrate SUB1 comprises the first conductive layer L1. The first conductive layer L1 has a quadrangular shape. The first conductive layer L1 has a first line L1a and a second line L1b. The first line L1a is shaped in letter Π and the second line L1b is located on an inner side than the first line L1a and shaped in letter Π, in a state of viewing the display device DSP in plane. Each of the first line L1a and the second line L1b includes an extending portion which extends in the first direction X and two extending portions which extend in the second direction Y. The array substrate SUB1 may further comprise a lead line LE. The lead line LE is located in the non-display area NDA of the array substrate SUB1. The lead line LE is connected with each end of the first line L1a or each end of the second line L1b in a one-to-one relationship. The lead line LE is formed by using at least one of the conductive line located in the same layer as the scanning line CL and the conductive line located in the same layer as the signal line SL, which will be explained later.

The end of the first line L1a is formed by integrating a plurality of wire portions TL to be explained later, and the integrated portion is connected to the lead line LE. The end of the second line L1b is also formed similarly to the end of the first line L1a.

The array substrate SUB1 comprises the dummy electrodes DE in the display area DA. The dummy electrodes DE are located remote from the first line L1a and the second line L1b. Such a dummy electrode DE is not connected to any lines and circuits in the display panel PNL and is in an electrically floating state. A configuration in which the dummy electrode DE is connected to a GND power source provided in a different layer can also be employed. The dummy electrode DE is located in an area AR on the inner peripheral side of the second line L1b of the array substrate SUB1.

The first line L1a, the second line L1b and the dummy electrode DE are provided on the third insulating film 13 shown in FIG. 4 and thereby located in the same plane (X-Y plane). The first line L1a, the second line L1b and the dummy electrode DE are formed of the same material. The dummy electrodes DE provided on the array substrate SUB1 can contribute to planarization of the surface of the fourth insulating film 14 in the display area DA and can also contribute to planarization of the surface of the array substrate SUB1 on the side opposite to the counter-substrate SUB2. The first line L1a, the second line L1b and the dummy electrode DE are located remote from each other in planar view and disposed without being overlaid on each other. Most parts of the first line L1a and the second line L1b are located in the display area DA. Each of the first line L1a and the second line L1b has a substantially constant width W1. The lead line LE has a substantially constant width W3.

In the present embodiment, the width W3 is equal to the width W1. Unlike the present embodiment, however, the width W3 may be larger than the width W1. Or the width W3 may be smaller than the width W1. The width W3 is desirably larger than or equal to the width W1 and the increase in resistance of the lead line LE can be thereby suppressed.

In the display device DSP, the printed board 3 serving as a second substrate comprises a second conductive layer L2, a bridge line BW and the like. The driver IC chip 4 of the display device DSP is mounted on the printed board 3. The driver IC chip 4 is configured to drive the coil AT. The driver IC chip 4 may be disposed on a board other than the printed board 3. In addition, a drive circuit for driving the coils AT may be built in the other driver IC chip (not shown) instead of omitting the driver IC chip 4.

The second conductive layer L2 includes a first line L2a, a second line L2b, a third line L2c and a fourth line L2d.

The first line L2a connects the first line L1a with the driver IC chip 4. More specifically, an end of the first line L2a is connected to the lead line LE connected to the first line L1a while the other end of the first line L2a is connected to the driver IC chip 4.

The second line L2b includes an extending portion which extends in the first direction X, outside the region opposed to the array substrate SUB1. The first line L2b connects the first line L1a with the second line L1b. More specifically, an end of the second line L2b is connected to the lead line LE connected to the first line L1a while the other end of the second line L2b is connected to the lead line LE connected to the second line L1b.

The third line L2c includes an extending portion which extends in the first direction X, outside the region opposed to the array substrate SUB1. The third line L2c connects the second line L2a with the bridge line which will be explained later. More specifically, an end of the third line L2c is connected to the lead line LE connected to the second line L2a.

The fourth line L2d connects the driver IC chip 4 with the bridge line which will be explained later. More specifically, an end of the fourth line L2d is connected to the driver IC chip 4.

The bridge line BW is provided to intersect the second line L2b but is not connected with the second line L2b. An end of the bridge line BW is connected to the other end of the third line L2c while the other end of the bridge line BW is connected to the other end of the fourth line L2d. The bridge line BW is located in a layer different from the layer in which the first line L2a to the fourth line L2d are located, which will be explained later.

The coil AT shown in FIG. 5 is shaped in a loop winding at approximately two times on the array substrate SUB1 and the printed board 3. The first line L2a, the first line L1a, the second line L2b and the like form a first loop portion as a portion winding at one time. The second line L1b, the third line L2c, and the like are located inside the first loop portion to form a second loop portion as a portion winding at one time.

The configuration of the coil AT is not limited to the example illustrated. For example, the shape of the coil AT can be selected from various shapes such as a circular shape, a quadrangular shape, and a polygonal shape. In addition, in the example illustrated, the coil AT is shaped in a loop winding approximately two times but the number of winding is not limited and may be one time or three or more times. The dummy electrode may not be provided.

The array substrate SUB1 has a first side S1. The printed board 3 has a second side S2 along an entire of the first side S1 of the array substrate SUB1. The second side S2 corresponds to the first side S1. A part of the coil AT is formed along the second side S2 of the printed board 3. A part of the coil AT is not formed along the first side S1 of the array substrate SUB1.

Figure 6:
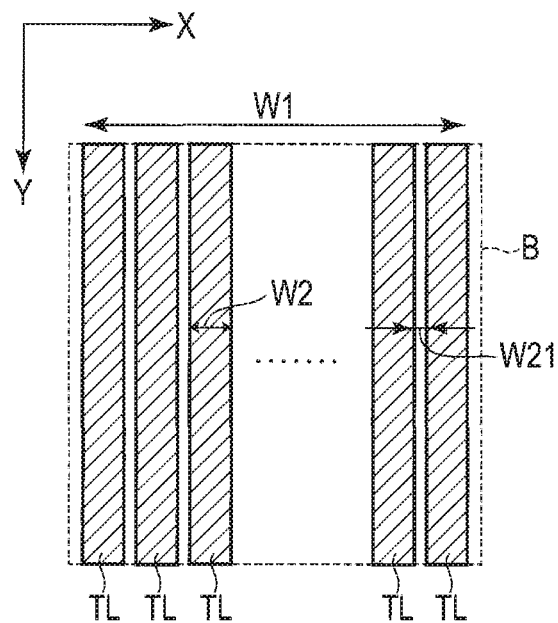
FIG. 6 is an enlarged plan view showing a region of the coil shown in FIG. 5.

FIG. 6 is an enlarged plan view showing a region B of the coil AT shown in FIG. 5.

As shown in FIG. 6, a first line L1a of the coil AT is composed of a plurality of wire portions TL. Not only the first line L1a, but also the second line L1b are composed of the wire portions TL. The wire portions TL extend in the second direction Y. As explained above, the width W1 of the coil AT is set at, for example, approximately 2 mm. The width W2 of the wire portion TL is set to be, for example, a width of one unit pixel or two unit pixels. For example, the width W2 of the wire portion TL is set to be in a range of, for example, approximately 140 to 280 μm. A gap W21 between the adjacent wire portions TL is desirably equal to the gap W11 of the first and second loop portions shown in FIG. 5. By thus forming the first line L1a or the like of the wire portions TL, a difference between the gap W21 of the adjacent wire portions TL and the gap W11 of the first and second loop portions, the first conductive layer L1 can be disposed at a certain density in the display area DA, and a difference in height resulting from the first conductive layer L1 can be reduced in the display area DA.

Figure 7:
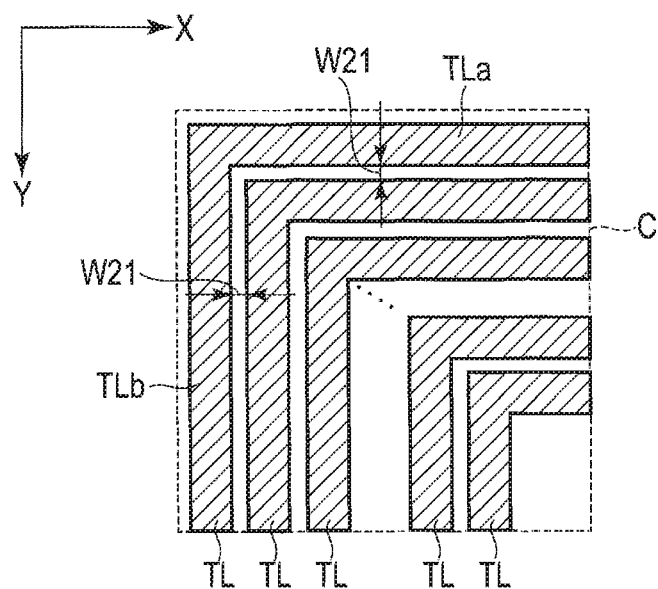
FIG. 7 is an enlarged plan view showing another region of the coil shown in FIG. 5.

FIG. 7 is an enlarged plan view showing a region C of the coil AT shown in FIG. 5.

As shown in FIG. 7, the wire portions TL are bent, and include wire portions TLa extending in the first direction X and wire portions TLb extending in the second direction Y. In FIG. 7, too, the gaps W21 between the adjacent wire portions TLa and between the adjacent wire portions TLb are desirably equal to the gap W11 shown in FIG. 5.

Figure 8:
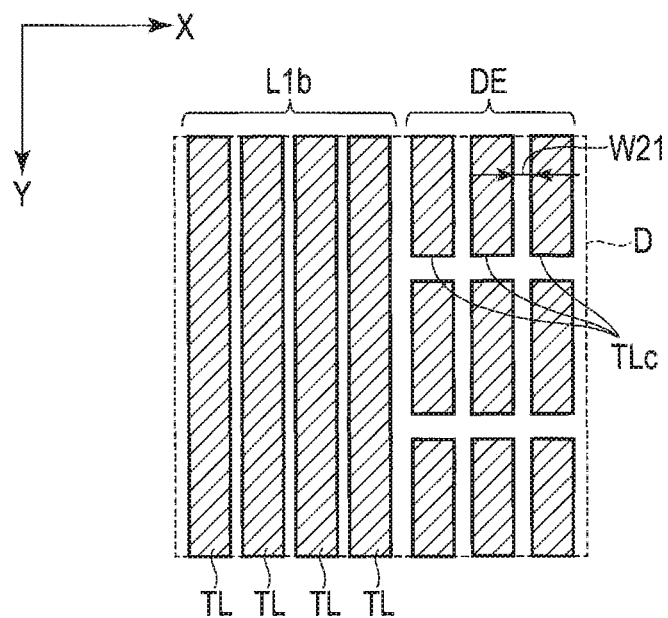
FIG. 8 is an enlarged plan view showing yet another region of the coil shown in FIG. 5.

FIG. 8 is an enlarged plan view showing a region D of the coil AT shown in FIG. 5.

As shown in FIG. 8, the area D is an area extending across the second line L1b and the dummy electrode DE. The dummy electrodes DE are composed of the wire portions TLc, similarly to the second line L1b. In this case, the wire portions TLc of the dummy electrode DE are desirably formed to have similar width W2 to the wire portions TL of the second line L1b. The gap W21 between the adjacent wire portions TLc is desirably equal to the gap W11 shown in FIG. 5.

Figure 9:
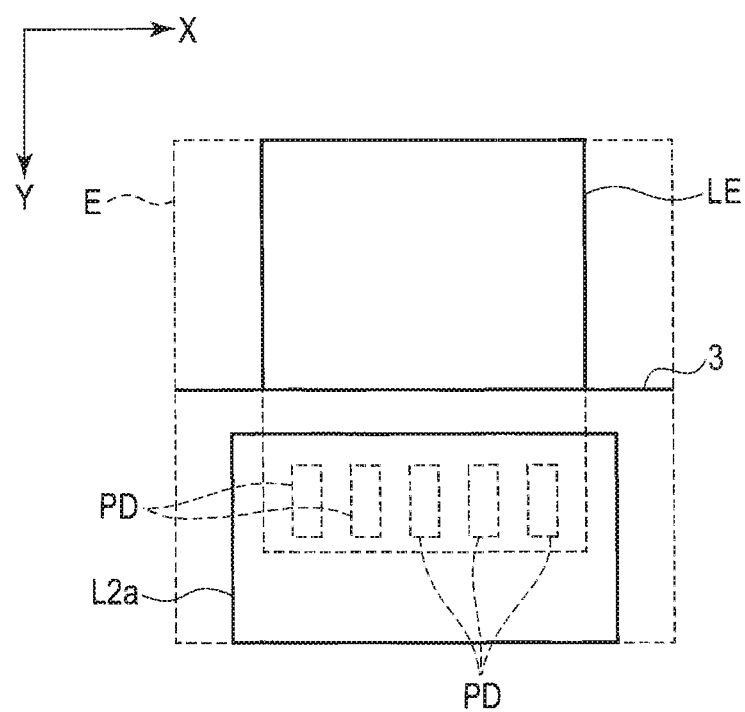
FIG. 9 is an enlarged plan view showing yet another region of the coil shown in FIG. 5.

FIG. 9 is an enlarged plan view showing a region E of the coil AT shown in FIG. 5.

As shown in FIG. 9, the array substrate SUB1 further comprises a plurality of pads PD located at end portions of the array substrate SUB1. A plurality of pads PD are connected to one lead line LE. For this reason, the first line L1a is connected to the pads PD via the lead line LE.

The first line L2a is opposed to all the pads PD connected to the lead line LE and covers all the pads PD. For this reason, the first line L2a is connected to the first line L1a via the pads PD and the lead line LE. The first line L2a is connected to the lead line LE via the pads PD. For this reason, the increase in resistance between the first line L2a and the lead line LE can be suppressed as compared with a case where the first line L2a is connected to the lead line LE via the single pad PD.

The above-explained matter can be applied to not only the first line L2a but the second line L2b and the third line L2c. Each of the second line L2b and the third line L2c is connected to the lead line LE via the pads PD.

In addition, the array substrate SUB1 comprises not only the pads PD for the coil AT, but also pads for the display drive. For this reason, the pads of the array substrate SUB1 may be arranged at regular pitches in the first direction X.

Figure 10:
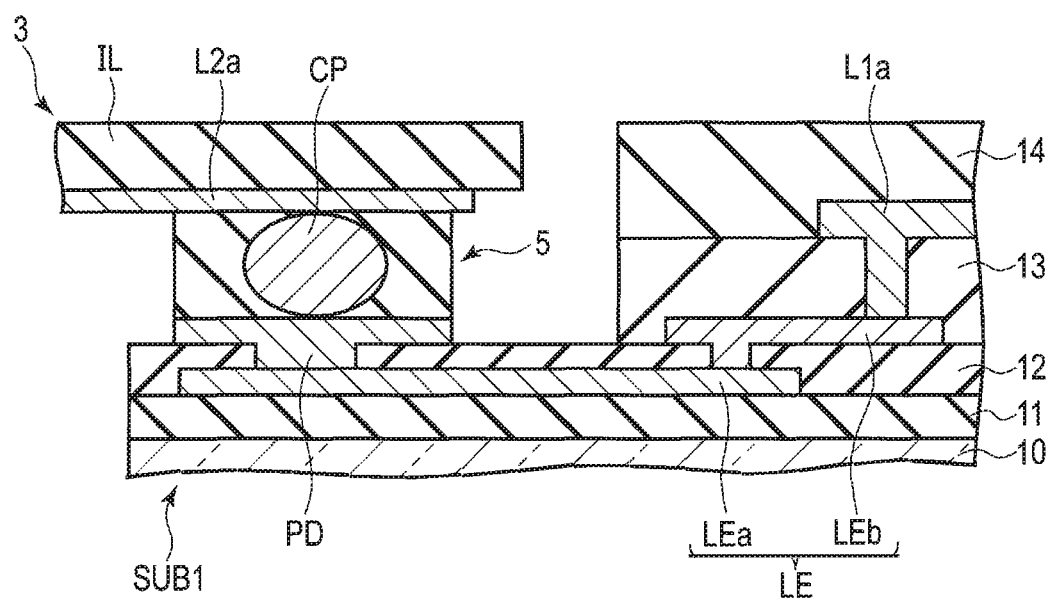
FIG. 10 is a cross-sectional view showing the display device seen along line X-X in FIG. 5, illustrating several parts of a printed board and an end portion of the array substrate.

FIG. 10 is a cross-sectional view showing the display device DSP seen along line X-X in FIG. 5, illustrating several parts of a printed board 3 and an end portion of the array substrate SUB1.

As shown in FIG. 10, each of the lead lines LE includes a conductive line LEa and a conductive line LEb. The conductive line LEa is located on the first insulating film 11 and covered with the second insulating film 12. The conductive line LEa is a conductive line located in the same layer as the scanning line CL. The conductive line LEa can be formed of the same material as the scanning line CL, simultaneously, together with the scanning line CL. The conductive line LEb is located on the second insulating film 12 and covered with the third insulating film 13. The conductive line LEb is in contact with the conductive line LEa through the contact hole formed in the second insulating film 12. The conductive line LEb is a conductive line located in the same layer as the signal line SL. The conductive line LEb can be formed of the same material as the signal line SL, simultaneously, together with the signal line SL.

The first line L1a is located on the third insulating film 13 and is in contact with the conductive line LEb through the contact hole formed in the third insulating film 13. The third insulating film 13 and the fourth insulating film 14 are not formed to be opposed to the entire region of the first insulating substrate 10, but formed except the region forming the pad PD.

The pad PD is located on the second insulating film 12. The pad PD is in contact with the conductive line LEa through the contact hole formed in the second insulating film 12. The pad PD is formed of, for example, a transparent conductive material such as ITO or IZO. The pad PD can be formed of the same material as the connection line RE, simultaneously, together with the connection line RE shown in FIG. 4.

Resin such as polyimide is used as a base of the printed board 3. The printed board 3 comprises the insulating layer IL and a metal line formed in the insulating layer IL. The insulating layer IL is a flexible layer having flexibility. For this reason, the printed board 3 of the present embodiment is a flexible substrate. The first line L2a is located on a side opposed to the pad PD of the insulating layer IL.

The metal line of the printed board 3 is formed of, for example, metal foil. Examples of the metal foil include copper foil formed of copper, silver foil formed of silver, aluminum foil formed of aluminum and the like. In the present embodiment, the metal line of the printed board 3 is formed of copper foil. The metal line which hardly causes crack and cleavage can be obtained by using copper.

The array substrate SUB1 and the printed board 3 are electrically connected and adhered to each other via an anisotropic conductive film 5 formed of a conductive material. The anisotropic conductive film 5 contains conductive particles CP dispersed in an adhesive. For this reason, the printed board 3 and the array substrate SUB1 are connected to each other electrically and physically by pressing the printed board 3 against the array substrate SUB1, pressing the array substrate SUB1 against the printed board 3 and heating the printed board 3 and the array substrate 1, in a state in which the anisotropic conductive film 5 is intervened between the printed board 3 and the array substrate SUB1. The conductive particles CP can be pressed to electrically connect the first line L2a with the pad PD.

Figure 11:
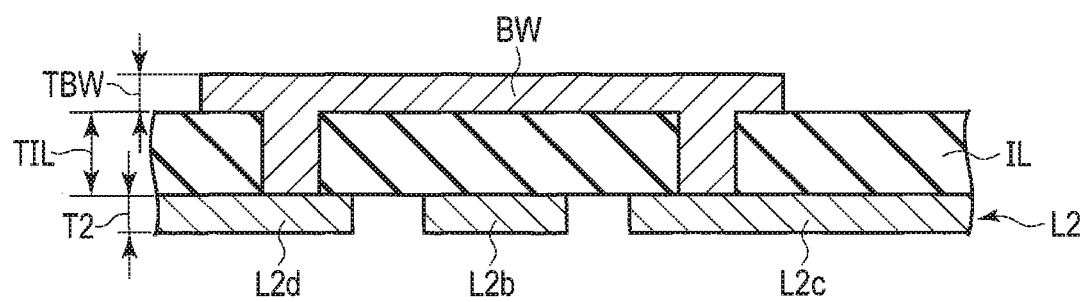
FIG. 11 is a cross-sectional view showing the printed board seen along line XI-XI of FIG. 5.

FIG. 11 is a cross-sectional view showing the printed board 3 seen along line XI-XI of FIG. 5.

As shown in FIG. 11, the insulating layer IL is located between the bridge line BW and the second conductive layer L2 including the first line L2a, the second line L2b, the third line L2c and the fourth line L2d. A plurality of via holes are formed in the insulating layer IL. The bridge line BW is electrically connected to the third line L2c through the via hole and electrically connected to the fourth line L2d through the other via hole. Both surfaces of the printed board 3 are covered with an insulating protection film except the portion in contact with the array substrate SUB1, which is not illustrated.

The insulating layer IL has a thickness TIL. Each of the first line L2a, the second line L2b, the third line L2c and the fourth line L2d has a thickness T2. The bridge line BW has a thickness TBW.

In the present embodiment, the thickness TIL of the insulating layer IL is 25 µm. The thickness TIL is a mere example and may be a thickness other than 25 µm such as 12 µm. In any case, the thickness TIL is larger than the thickness T13 of the third insulating film 13 and larger than the thickness T14 of the fourth insulating film 14.

In the present embodiment, each of the thickness T2 and the thickness TBW is 10 µm and the sheet resistance of each of the second conductive layer L2 and the bridge line BW is 0.002 Ω/□.

The thickness T2 and the thickness TBW are mere examples and can be variously changed. The thickness T2 and the thickness TBW may be values exceeding 10 µm. In any case, the thickness T2 and the thickness TBW are larger than the thickness T1 of each of the first line L1a and the second line L1b.

The sheet resistance of each of the second conductive layer L2 and the bridge line BW is a mere example and can be variously changed. The sheet resistance may be a value smaller than 0.002Ω/□. The sheet resistance of the first conductive layer L1 is higher than the sheet resistance of the second conductive layer L2, and the sheet resistance of the first conductive layer L1 is higher than the sheet resistance of the bridge line BW. The sheet resistance of the first conductive layer L1 is desirably ten or more times higher than the sheet resistance of the second conductive layer L2, and the sheet resistance of the first conductive layer L1 is desirably ten or more times higher than the sheet resistance of the bridge line BW. In any case, the sheet resistance of the first conductive layer L1 is ten or more times higher than the sheet resistance of at least one of the second conductive layer L2 and the bridge line BW.

The printed board 3 shown in FIG. 11 and the like is not limited but is a mere example. The printed board 3 may have a more multi-layered structure formed by further stacking a metal line and an insulating layer. For example, each of the first line L2a, the second line L2b, the third line L2c, the fourth line L2d and the bridge line BW may be formed of a metal line of two or more layers. In any cases, the printed board 3 may comprise one insulating layer and two metal line layers located on both sides of the insulating layer, and the second conductive layer L2 and the bridge line BW can be thereby provided in layers different from each other.

Figure 12:
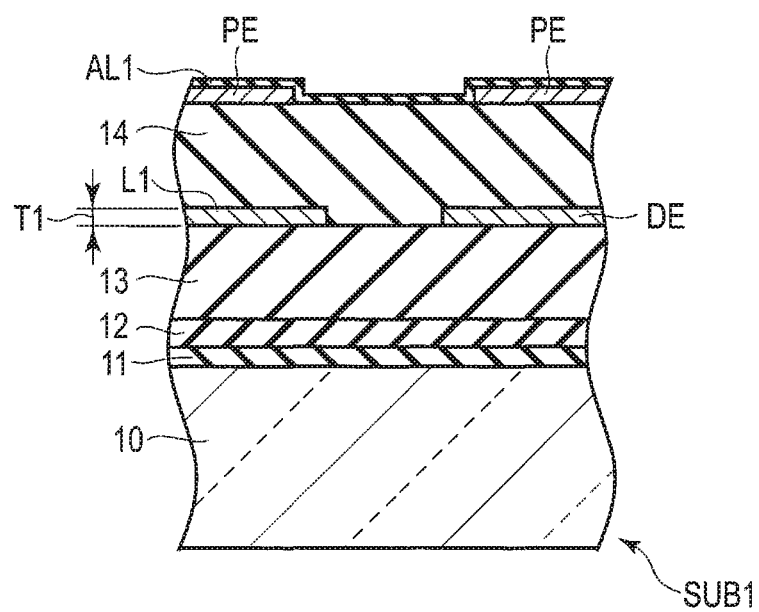
FIG. 12 is another cross-sectional view showing the array substrate of the display panel.

FIG. 12 is another cross-sectional view showing the array substrate SUB1 of the display panel PNL.

As shown in FIG. 12, the dummy electrode DE is located on the third insulating film 13. In other words, the dummy electrode DE is located in the same layer as the first conductive layer L1. The dummy electrode DE is formed of, for example, the same material as the first conductive layer L1, in the same process as a process of forming the first conductive layer L1. The first conductive layer L1 and the dummy electrode DE are formed to have the same thickness T1. By disposing such a dummy electrode DE, a difference in height in the layer in which the first conductive layer L1 is located can be reduced, the reflectance can be uniformed on the entire display panel PNL, and non-uniformity in display and the like can be prevented.

Figure 13:
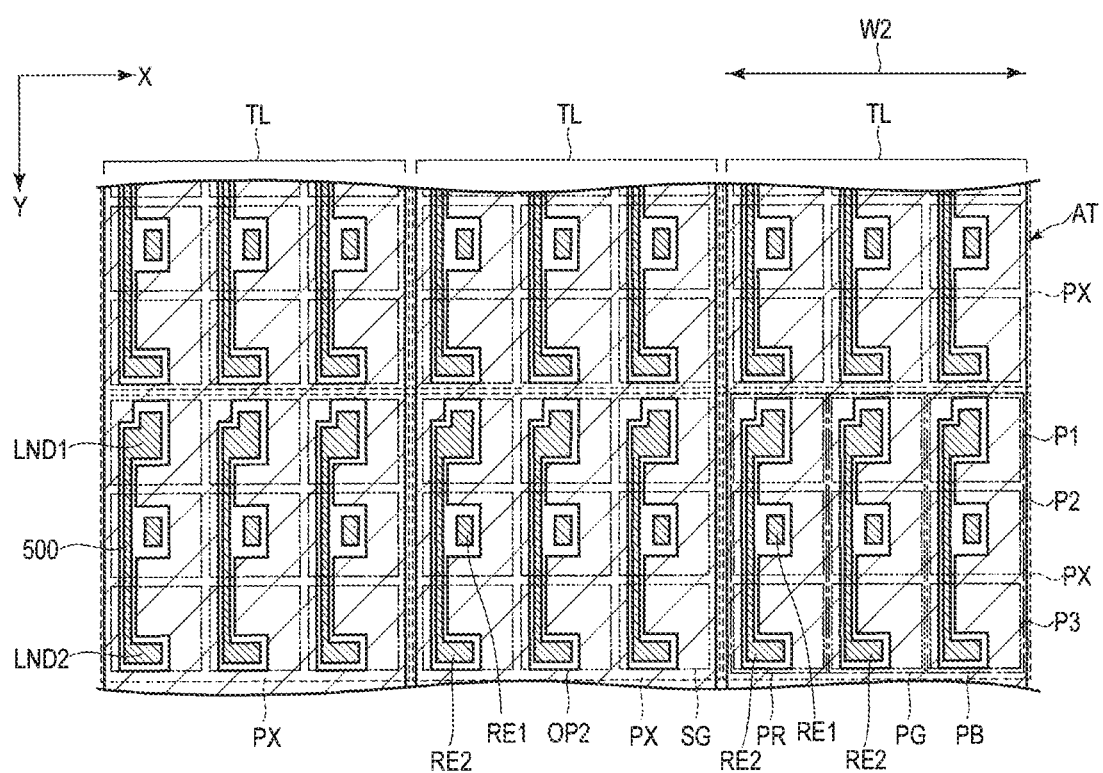
FIG. 13 is a plan view showing a positional relationship between a first conductive layer and connection lines.

FIG. 13 is a plan view showing a positional relationship between the first conductive layer L1 and the connection lines RE.

As shown in FIG. 13, one unit pixel PX is composed of three sub-pixels PR, PG and PB and each of the sub-pixels PR, PG and PB comprises three partial electrodes P1 to P3. In the figure, each of the unit pixels PX is represented by a dashed line, each of the sub-pixels PR, PG and PB is represented by a one-dot chain line, and each of the partial electrodes P1 to P3 is represented by a two-dot chain line.

In the example illustrated, the unit pixel PX is formed in a square, a length of the unit pixel PX in the first direction X and a length of the unit pixel PX in the second direction Y are equal or approximately equal to each other and, for example, each side has a length in a range of 100 to 200 µm (for example, approximately 140 µm).

The connection lines RE1 and RE2 are disposed in each of the sub-pixels PR, PG and PB. The connection line RE1 is connected to the partial electrode P2. The connection line RE2 is connected to the partial electrodes P1 and P3. The connection line RE1 is shaped in a quadrangle and overlaid on the partial electrode P2 in planar view, and the partial electrode P2 is in contact with the connection line RE1 through the fourth insulating film 14. The connection line RE2 includes a wide land portion LND1 opposed to the partial electrode P1, a wide land portion LND2 opposed to the partial electrode P3, and a connection line 500 connecting a pair of land portions to each other. The connection line 500 is formed to be spaced apart from one of sides of the connection line RE1.

In the example illustrated, the width W2 of one wire portion TL of the first conductive layer L1 corresponds to the width of one unit pixel PX. The wire portion TL includes an opening OP2 at a position overlaid on the partial electrodes P1 to P3. The connection lines RE1 and RE2 are disposed inside the opening OP2 of the wire portion TL. In other words, the first conductive layer L1 is located around the connection lines RE1 and RE2.

The connection line RE2 may be shaped in a loop surrounding the connection line RE1. However, if the connection line RE2 extends on one of sides of the connection line RE1 as illustrated in the drawing, an area of installation of the first conductive layer L1 can be increased, more desirably, as compared with a case where the connection line RE2 is shaped in a loop.

According to the display device DSP of the embodiment constituted as explained above, the display device DSP comprises the array substrate SUB1 and the printed board 3. The array substrate SUB1 includes the scanning line CL, the signal line SL, and the first conductive layer L1 located in the layer different from the scanning line CL and the signal line SL. The printed board 3 includes the second conductive layer L2, the bridge line BW and the insulating layer IL. The second conductive layer L2 is connected to the first conductive layer L1 and has the thickness T2 larger than the thickness T1 of the first conductive layer L1. The bridge line BW has the thickness TBW larger than the thickness T1 of the first conductive layer L1 and is connected to the second conductive layer L2. The insulating layer IL is located between the second conductive layer L2 and the bridge line BW.

The coil AT is formed by the first conductive layer L1, the second conductive layer L2, and the bridge line BW. Since the coil AT is formed by using both the array substrate SUB1 and the printed board 3, the area of the entire coil AT can be increased as compared with a case where the coil AT is formed by using the array substrate SUB1 alone. In addition, since the bridge line BW is formed on the printed board 3, the area for formation of the bridge line BW does not need to be secured on the array substrate SUB1. Inductance of the coil AT can be increased. For this reason, the intensity and sensitivity of the coil AT can be increased. The intensity and sensitivity of the coil AT are determined based on the area of the coil AT, the number of times of loop and the resistance. The number of times of loop can be thereby reduced as compared with a case where, for example, the coil AT is formed by using the array substrate SUB1 alone.

The array substrate SUB1 includes the first insulating substrate (glass substrate) 10 opposed to the scanning line CL, the signal line SL and the first conductive layer L1. The printed board 3 is a flexible board. The thickness TIL of the insulating layer IL is larger than the thickness T13 of the third insulating film 13 and larger than the thickness T14 of the fourth insulating film 14. The thickness TIL is approximately ten times as large as each of the thickness T13 and the thickness T14. For this reason, parasitic capacitance generated at the coil AT can be reduced as compared with a case where the bridge line BW of the coil AT is provided on the array substrate SUB1 side.

When the coil AT is formed, one serial wire is formed in an annular shape and both ends of the wire are connected to the driver IC chip 4, and the bridge line BW connected in the different layer while avoiding the annular portion needs to be formed. It can be understood from the above that degradation in performance of the coil AT can be suppressed since a parasitic capacitance between the second line L2$b$ and the bridge line BW can be reduced.

The thickness T1 of the first conductive layer L1 is 500 nm and the sheet resistance of the first conductive layer L1 is 0.028Ω/□. Each of the thickness T2 of the second conductive layer L2 and the thickness TBW of the bridge line BW is 10 µm, and the sheet resistance of each of the second conductive layer L2 and the bridge line BW is 0.002 Ω/□.

The thickness T1 is equal to or smaller than one tenths of each of the thickness T2 and the thickness TBW. The sheet resistance of the first conductive layer L1 is ten or more times higher than the sheet resistance of each of the second conductive layer L2 and the bridge line BW. In other words, the sheet resistance of each of the second conductive layer L2 and the bridge line BW can be set to be smaller than or equal to one tenth of the sheet resistance of the first conductive layer L1. As explained above, degradation in performance of the coil AT can also be suppressed from the viewpoint of reducing the sheet resistance of each of the second conductive layer L2 and the bridge line BW.

The coil AT has a loop shape which is not overlaid in the same plane. The second conductive layer L2 forms at least an entire of one side of the coil AT. The printed board 3 has a side (the second side S2) along an entire of one side (the first side S1) of the array substrate SUB1. Several parts of the coil AT are formed on the entire of the coil AT of the side along the entire of the one side (the first side S1) of the array substrate SUB1 on the printed board 3. Since the area for formation of the coil AT can be increased on the printed board 3 side, the entire area of the coil AT can be increased and the inductance of the coil AT can also be increased.

The pixel electrode PE includes three partial electrodes P1, P2 and P3. The connection lines RE1 and RE2 are located between the scanning line CL and the pixel electrode PE. Any two electrodes of the partial electrodes P1, P2 and P3 are connected to each other via the connection lines RE. In the present embodiment, two partial electrodes P1 and P3 are connected to each other via the connection line RE2. For this reason, $2^3$ gradations can be expressed by combination of the total control of the partial electrodes P1 and P3 and the independent control of the partial electrode P2.

Unlike the present embodiment, the reflecting electrode may be a pixel electrode PE comprising two or four or more partial electrodes P. At least any two electrodes of the partial electrodes P are connected to each other via the connection lines RE.

The array substrate SUB1 comprises the pads PD located at the end portions of the array substrate SUB1. The first conductive layer L1 is connected to the pads PD via at least one of the conductive line located in the same layer as the scanning line CL and the conductive line located in the same layer as the signal line SL. In the present embodiment, for example, the first line L1a is connected to the pads PD by using both the conductive line LEa located in the same layer as the scanning line CL and the conductive line LEb located in the same layer as the signal line SL. The conductive line LEa can be formed of the same material as the scanning line CL, simultaneously, together with the scanning line CL, and the conductive line LEb can be formed of the same material as the signal line SL, simultaneously, together with the signal line SL. For this reason, the lead line LE can be formed without adding a manufacturing process.

The array substrate SUB1 further comprises the dummy electrodes DE. The dummy electrodes DE are located in the same layer as the first conductive layer L1 and spaced apart from a part of the coil AT in the first conductive layer L1 (for example, the wire portion TL), and have the same thickness as the thickness T1 of the first conductive layer L1.

Since the dummy electrodes DE are disposed in the space in which the first line L1a and the second line L1b do not exist in the display area DA, the dummy electrodes DE can contribute to planarization of the surface of the fourth insulating film 14 in the display area DA. The dummy electrodes DE can also contribute to planarization of the surface of the array substrate SUB1 on the side opposed to the counter-substrate SUB2.

The display device DSP capable of making the performance higher can be obtained based on the above descriptions.

Next, the display device DSP according to modified example 1 of the embodiment will be explained. FIG. 14 is a plan view showing the display device DSP according to modified example 1 of the embodiment, illustrating an example of arrangement of the coil AT, the dummy electrodes DE and the like.

As shown in FIG. 14, the display device DSP of modified example 1 is different from the example shown in FIG. 5 with respect to the shape of the coil AT, the position of the pads PD, and the shape of the printed board 3.

Several parts of the lower side (one of sides) of the coil AT are formed by the second line L2b and the other parts are formed by the first line L1a and the second line L1b, in X-Y planar view. The parts forming the lower side of the coil AT, of the first line L1a and the second line L1b, are located in a region on the lower side of the display area DA and extend in the first direction X. Each of the first line L1a and the second line L1b is shaped in letter P.

The pads PD can be collected at one place of the end portion of the array substrate SUB1 by changing the shape of each of the first line L1a and the second line L1b from Π-letter shape to p-letter shape. The printed board 3 used for the coil AT can be thereby miniaturized and its manufacturing costs can be reduced.

According to the display device DSP of modified example 1 configured as explained above, the second line L2b (second conductive layer L2) forms the parts of one side of the coil AT. The array substrate SUB1 is shaped in a quadrangle. The printed board 3 has a side (the second side S2) along several parts of one side (the first side S1) of the array substrate SUB1. A part of the coil AT is formed along the second side S2 of the printed board 3. In the modified example 1, several parts of the coil AT are formed on the entire of the side along several parts of one side of the array substrate SUB1 on the printed board 3. However, the display device DSP of modified example 1 is formed in an approximately similar manner to the display device DSP of the embodiment except the above-explained points. For this reason, the same advantages as those of the embodiment can also be obtained from modified example 1.

Figure 15:
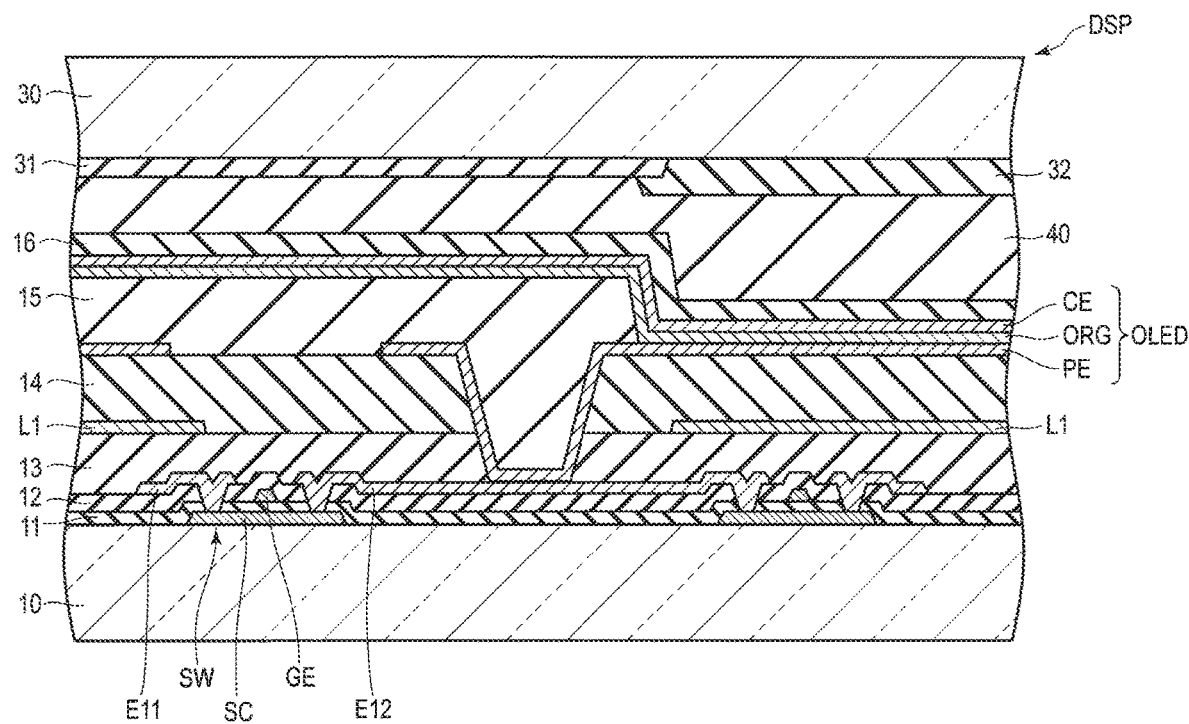
FIG. 15 is a cross-sectional view showing a display device according to modified example 2 of the embodiment.

Next, the display device DSP according to modified example 2 of the embodiment will be explained. FIG. 15 is a cross-sectional view showing a display device DSP according to modified example 2 of the embodiment.

As shown in FIG. 15, the display device DSP according to modified example 2 is an organic electroluminescent (EL) display device. The display device DSP adopts an organic emitting layer as a display function layer.

The switching element SW comprises a semiconductor layer SC located between the first insulating substrate 10 and the first insulating film 11, a gate electrode GE located between the first insulating film 11 and the second insulating film 12, and a first electrode E11 and a second electrode E12 located between the second insulating film 12 and the third insulating film 13.

The first conductive layer L1 is located between the third insulating film 13 and the fourth insulating film 14. The first conductive layer L1 can be disposed in the display area DA similarly to any one of the examples shown in FIG. 5 and FIG. 14.

An organic EL element OLED is located on the fourth insulating film 14. The organic EL element OLED comprises a pixel electrode PE, an organic emitting layer ORG, and a common electrode CE. The organic emitting layer ORG corresponds to a display function layer. Either of the pixel electrode PE and the common electrode CE functions as an anode while the other functions as a cathode.

The pixel electrode PE is located on the fourth insulating film 14 and is in contact with the second electrode E12. The pixel electrode PE functions as a reflecting electrode which urges the light emitted from the organic emitting layer ORG to be reflected toward the display surface. Alternatively, the pixel electrode PE can be formed of ITO and the light reflecting layer formed of a metallic material can be provided separately in the lower layer of the pixel electrode PE.

The organic emitting layer ORG may be formed of, for example, an emitting material which emits monochromatic light of red, green or blue or may be configured to emit white light by mixing a plurality of emitting materials. Alternatively, the organic emitting layer ORG may include functional layers such as a hole transport layer, a hole injection layer, an electron-transport layer, and an electron-injection layer as needed. The organic EL element OLED configured as explained above corresponds to what is called a top emission type organic LE element which emits the light toward the cover member 30.

A bank 15 sections the organic EL element OLED separately. A barrier film 16 is formed of a transparent material, to suppress entrance of moisture or the like into the organic EL element OLED.

The cover member 30 is formed of transparent glass or resin. A light-shielding layer 31, a color filter 32 and the like are provided on a side of the cover member 30 which is opposed to the organic EL element OLED. An interval between the barrier film 16, and the light-shielding layer 31 and the color filter 32 is filled with a transparent filler 40.

In such a display device DSP, too, space to dispose the first conductive layer L1 between the first insulating substrate 10 and the organic EL element OLED can be secured in the display area DA since the organic EL element OLED is the top emission type element. The first conductive layer L1 (coil AT) can be therefore built in the display device DSP without increasing the thickness of the entire of the display device DSP.

Figure 16:
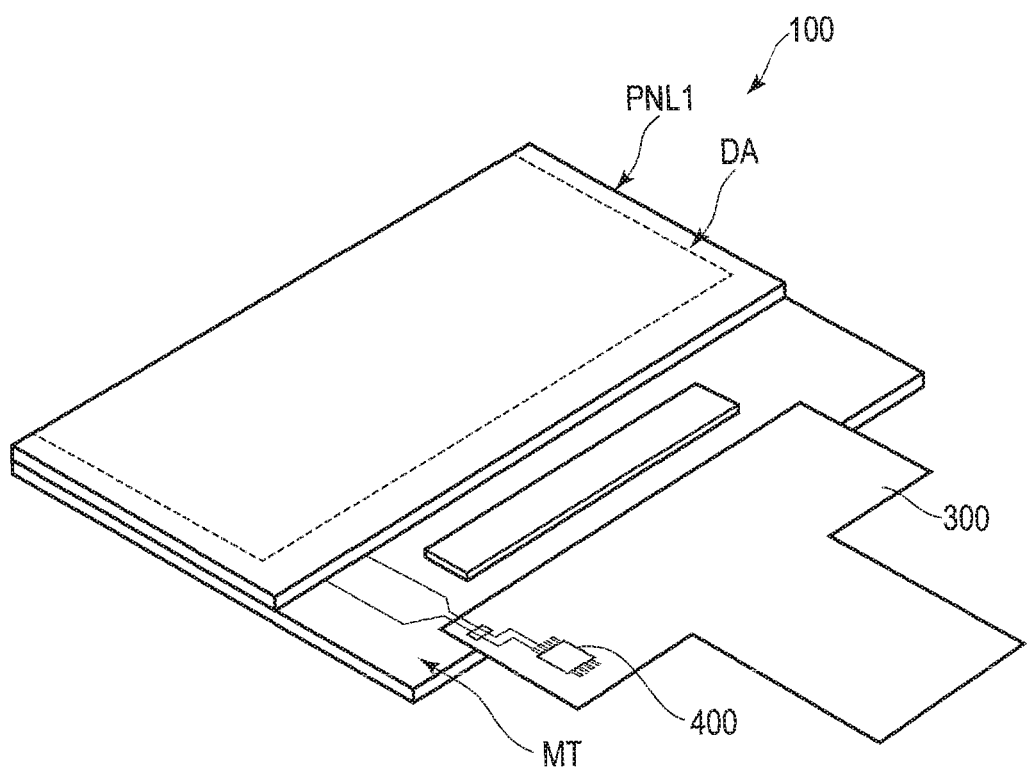
FIG. 16 is an illustration showing an example of applying the embodiment to an electronic device.

Next, an example of applying the embodiment to an electronic device will be explained. FIG. 16 is an illustration showing an example of applying the embodiment to an electronic device 100.

As shown in FIG. 16, a driver IC chip 400, a printed board 300, and a display panel PNL1 correspond to the driver IC chip 4, the printed board 3, and the display panel PNL shown in FIG. 5, respectively, and perform substantially the same operations. The electronic device 100 can be used for, for example, a card type display, a shelf label and the like for the purpose of rewriting a display content by the short-range wireless communication function. Alternatively, the coil AT of the electronic device 100 can also be used for charging.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the printed board is not limited to the flexible board. The printed board may be a rigid board or a rigid flexible board. The rigid board is formed by using a rigid material such as glass epoxy or the like as its base. An insulating layer of the rigid board is a rigid layer having rigidity. For this reason, the rigid board is a board in which a metal line and the like are formed in the rigid layer. The rigid flexible board is a board formed by combining the rigid board and the flexible board. The rigid flexible board comprises both the flexible layer and the rigid layer.

The first conductive layer L1 may be formed on the rear surface side of the array substrate SUB1. The rear surface of the array substrate SUB1 is the surface on the opposite side to the surface of the first insulating substrate 10 which is opposed to the counter-substrate SUB2. In this case, the coil AT can be formed by disposing the printed board 3 on the rear surface of the array substrate SUB1 and connecting the second conductive layer L2 to the first conductive layer L1. Alternatively, the printed board 3 can be disposed on the surface of the array substrate SUB1 and the second conductive layer L2 can be connected to the first conductive layer L1, via the contact electrode formed on the through hole penetrating the first insulating substrate 10, and the like.

The display device DSP comprising a reflective type liquid crystal display panel has been explained as an example of the display device in the above embodiment. The above-described embodiments can be applied to various types of display devices. For example, the display device DSP may comprise a transmissive type liquid crystal display panel. In the transmissive type display panel, however, desirably, a third substrate such as a glass substrate is disposed on the rear surface side of the illumination device and the first conductive layer L1 is formed on this substrate.

What is claimed is:

1. An electronic device, comprising:
   a first substrate including a first conductive layer, the first conductive layer including a first conductive line; and
   a second substrate including
     a second conductive layer including a second conductive line connected to the first conductive line,
     a bridge line intersecting the second conductive line at an intersection in a plan view, wherein a first direction is normal to a plane of the plan view, and
     an insulating layer located between the second conductive line and the bridge line at the intersection,
   wherein
   the first conductive line does not intersect the bridge line in the plan view,
   along the first direction, a thickness of the second conductive line and a thickness of the bridge line at the intersection are larger than a thickness of the first conductive line, and
   the first conductive line, the second conductive line and the bridge line form a coil.

2. The electronic device of claim 1, wherein
   the first substrate is a glass substrate, and
   the second substrate is a flexible substrate.

3. The electronic device of claim 1, wherein
   a sheet resistance of the first conductive layer is ten or more times higher than a sheet resistance of at least one of the second conductive layer and the bridge line.

4. The electronic device of claim 1, wherein
   the coil is shaped in a loop not overlaid in a same plane.

5. The electronic device of claim 1, wherein
   the first substrate has a first side,
   the second substrate has a second side along an entire of the first side of the first substrate, and
   a part of the coil is formed along the second side of the second substrate.

6. The electronic device of claim 1, wherein
   the first substrate has a first side,
   the second substrate has a second side along a part of the first side of the first substrate, and
   a part of the coil is formed along the second side of the second substrate.

7. The electronic device of claim 1, wherein
   the first substrate has a first side,
   the second substrate has a second side corresponding to the first side, and
   a part of the coil is not formed along the first side of the first substrate.

8. A display device, comprising:
   a first substrate including
     a scanning line,
     a signal line, and
     a first conductive layer including a first conductive line located in a layer different from a layer of the scanning line and the signal line; and
   a second substrate including
     a second conductive layer including a second conductive line connected to the first conductive line,
     a bridge line intersecting the second conductive line at an intersection in a plan view, wherein a first direction is normal to a plane of the plan view, and
     an insulating layer located between the second conductive line and the bridge line at the intersection,
   wherein
   the first conductive line does not intersect the bridge line in the plan view,
   along the first direction, a thickness of the second conductive line and a thickness of the bridge line at the intersection are larger than a thickness of the first conductive line, and
   the first conductive line, the second conductive line and the bridge line form a coil.

9. The display device of claim 8, wherein
the first substrate is a glass substrate, and
the second substrate is a flexible substrate.

10. The display device of claim 8, wherein
a sheet resistance of the first conductive layer is ten or more times higher than a sheet resistance of at least one of the second conductive layer and the bridge line.

11. The display device of claim 8, wherein
the coil is shaped in a loop not overlaid in a same plane.

12. The display device of claim 8, wherein
the first substrate has a first side,
the second substrate has a second side along an entire of the first side of the first substrate, and
a part of the coil is formed along the second side of the second substrate.

13. The display device of claim 8, wherein
the first substrate has a first side,
the second substrate has a second side along a part of the first side of the first substrate, and
a part of the coil is formed along the second side of the second substrate.

14. The electronic device of claim 8, wherein
the first substrate has a first side,
the second substrate has a second side corresponding to the first side, and
a part of the coil is not formed along the first side of the first substrate.

15. The display device of claim 8, further comprising:
a display function layer opposed to the first substrate; and
a reflecting electrode which is located between the signal line and the display function layer and to which an electric potential to display an image is applied,
wherein
the first conductive layer is located between the signal line and the reflecting electrode.

16. The display device of claim 15, further comprising:
a connection line located between the scanning line and the reflecting electrode,
wherein
the reflecting electrode is a pixel electrode including partial electrodes, and
at least any two of the partial electrodes are connected to each other via the connection line.

17. The display device of claim 15, wherein
the display function layer is a liquid crystal layer.

18. The display device of claim 8, wherein
the first substrate further includes a pad located at an end portion of the first substrate,
the first conductive line is connected to the pad via at least one of a conductive line located in a same layer as the scanning line and a conductive line located in a same layer as the signal line, and
the second conductive line is connected to the first conductive line via the pad.

19. The display device of claim 8, wherein
the first substrate further includes a dummy electrode which is located in a same layer as the first conductive line, and which is not connected to the first conductive line.

20. An electronic device, comprising:
a first substrate including a first conductive layer; and
a second substrate including
a second conductive layer which is connected to the first conductive layer and which has a thickness larger than a thickness of the first conductive layer,
a bridge line which has a thickness larger than the thickness of the first conductive layer and which is connected to the second conductive layer, and
an insulating layer which is located between the second conductive layer and the bridge line,
wherein
the first conductive layer, the second conductive layer and the bridge line form a coil, and
a sheet resistance of the first conductive layer is ten or more times higher than a sheet resistance of at least one of the second conductive layer and the bridge line.

* * * * *